United States Patent [19]
Essaian

[11] Patent Number: 5,877,977
[45] Date of Patent: Mar. 2, 1999

[54] NONVOLATILE MEMORY BASED ON METAL-FERROELECTRIC-METAL-INSULATOR SEMICONDUCTOR STRUCTURE

[75] Inventor: Stepan Essaian, Cupertino, Calif.

[73] Assignee: National Semiconductor Corporation, Santa Clara, Calif.

[21] Appl. No.: 707,916

[22] Filed: Sep. 10, 1996

[51] Int. Cl.$^6$ .................................................. G11C 11/40
[52] U.S. Cl. ..................................... 365/145; 365/185.01
[58] Field of Search .................................. 365/145, 149, 365/185.01; 257/295

[56] References Cited

U.S. PATENT DOCUMENTS

| | | | |
|---|---|---|---|
| 4,888,630 | 12/1989 | Patterson | 365/145 |
| 5,046,043 | 9/1991 | Miller et al. | 364/145 |
| 5,218,512 | 6/1993 | Nakamura | 365/145 |
| 5,300,799 | 4/1994 | Nakamura et al. | 365/145 |
| 5,309,392 | 5/1994 | Ootsuka et al. | 365/145 |
| 5,345,415 | 9/1994 | Nakao et al. | 365/145 |
| 5,361,224 | 11/1994 | Takasu | 365/145 |
| 5,495,117 | 2/1996 | Larson | 365/145 |
| 5,515,311 | 5/1996 | Mihara | 365/145 |
| 5,523,964 | 6/1996 | McMillan et al. | 365/145 |
| 5,559,733 | 9/1996 | McMillan et al. | 365/145 |
| 5,592,409 | 1/1997 | Nishimura et al. | 365/145 |

OTHER PUBLICATIONS

Y. Fujimori, N. Izumi, Takashi Nakamura, A. Kamisawa & Y. Shigematsu, Development of Low Dielectric Constant Ferroelectric Materials for the Ferroelectric Memory Field Effect Transistor, Jpn. J. Appl. Phys., vol. 36 (1997) Pt. 1, No. 9B, pp. 5935–5938.

E. Tokumitsu, T. Shimamura & H. Ishiwara, Electrical Properties of Ferroelectric–Capacitor–Gate Si MOS Transistors Using P (L) 2T ZT Films, Integrated Ferrelectrics, 1997, vol. 15, pp. 137–144.

R.E. Jones, Jr., et al., "Ferroelectric non–volatile memories for low–voltage, low–power applications", Thin Solid Films 270 (1995), pp. 584–588.

J.F. Scott et al., "Ferroelectric Memories", Science (1989), vol. 246, pp. 1400–1405.

S. Matsubara et al., "Preparation of epitaxial $ABO_3$ perovskite–type oxide thin films on a (100)$MgAl_2O_4$/Si substrate", J.Appl. Phys. 66(12), Dec. 15, 1989, pp. 5826–5832.

S. Shinharoy et al., "$BaMgF_4$ Thin Film Development and Processing for Ferroelectric Fets", Integrated Ferroelectrics, 1993, vol. 3, pp. 217–223.

Shu–Yau Wu, "A New Ferroelectric Memory Device, Metal–Ferroelectric–Semiconductor Transistor", IEEE Transactions on Electron Devices, vol. Ed–21, No. 8, Aug. 1974, pp. 499–504.

Yoshio Okada et al., "Relationship between growth conditions, nitrogen profile, and charge to breakdown of gate oxynitrides grown from pure $N_2O$", Appl. Phys. Lett. vol. 63 No. 2, Jul. 12, 1993, pp. 194–196.

Kazushi Amanuma et al., "Preparation and ferroelectric properties of $SrBi_2Ta_2O_9$ thin films", Appl. Phys. Lett. vol. 66, No. 2, Jan. 9, 1995, pp. 221–223.

*Primary Examiner*—A. Zarabia
*Attorney, Agent, or Firm*—Limbach & Limbach L.L.P.

[57] ABSTRACT

A new ferroelectric memory element is disclosed. The ferroelectric material exhibits little polarization fatigue up to $10^{12}$ switching cycles, long retention and minimal tendency to imprint, producing a nonvolatile, nondestructive readout memory element having low saturation voltage for switching. The memory element can be manufactured using conventional CMOS transistor technology and may include a $SrBi_2Ta_2O_9$ ferroelectric thin-film between metallic electrodes, and an oxide, optionally, conventional $SiN_xO_y$ layer or $Si_3N_4$—$SiO_2$ bilayer, to protect the substrate from contaminant migration from the ferroelectric layer. Platinum or a metal oxide material (e.g., $RuO_2$, $IrO_2$, $La_xSr_{1-x}CoO_3$) may serve as electrodes and provide a lattice matching material for the ferroelectric layer overlying the bottom electrode. Formation of $SrBi_2Ta_2O_9$ or other ferroelectric member of the layered perovskite family may be integrated into conventional CMOS transistor processing.

4 Claims, 1 Drawing Sheet

NONVOLATILE MEMORY BASED ON METAL-FERROELECTRIC-METAL-INSULATOR SEMICONDUCTOR STRUCTURE

BACKGROUND

1. Field of the Invention

The present invention relates to a new type of nonvolatile memory (NVM) based on a Metal-Ferroelectric-Metal-Insulator ($SiN_xO_y$)-Semiconductor (Si)(MFMIS) structure. More particularly, the present invention relates to a new NVM memory cell structure, i.e., a ferroelectric field effect transistor (FEFET) using a new ferroelectric material.

2. Description of the Related Art

Recently, there has been interest in the use of ferroelectric materials for NVM operations. Nonvolatile ferroelectric RAM (FERAM) is desirable because data can be written at high speed (1–100 ns) and at conventional supply voltages (3–5 V). However, FERAMs use a destructive readout followed by a rewrite that limits cycling. Conventional NVM based on CMOS technology e.g., flash memory, as used in wireless communication has relatively slower write speed ($^{18}$1 msec) and read/write capabilities of only about $10^6$ cycles. For nonvolatile memory applications, high speed read/write capabilities and a minimum of $10^{10}$ read/write cycles are preferred.

The following characteristics of ferroelectric materials make them attractive for memory applications: (1) the ability to retain two stable remanent polarizations ($\pm P_r$) at zero electrical field, enabling memory nonvolatility; and (2) the reversibility (by applying voltage) of remanent polarization $+P_r$ (1) to $-P_r$ (0) or vice versa. A typical ferroelectric material used is $PbZrTiO_3$ (also known as PZT); this material has a relatively high dielectric constant of about $\epsilon=1000$. A drawback of early ferroelectric memories was that the amount of switched charge decreased with use because of fatigue after a relatively few (e.g., $10^6$) cycles.

There are two types of ferroelectric memory. One type is achieved with a device in which a ferroelectric thin-film capacitor memory element is integrated into conventional CMOS transistor technology. This design provides destructive readout only, e.g., ferroelectric RAM (FERAM), and thus has relatively limited utility. The other type of ferroelectric memory is a nonvolatile memory device relying on a metal-ferroelectric-silicon structure (so called MFS FET or FEFET). In contrast to conventional CMOS FET, a FEFET structure has a ferroelectric thin film in the transistor instead of a $SiO_2$ insulator layer. A FEFET structure can be a useful NVM element since a change of the polarization direction of the ferroelectric film changes channel conductivity; no applied field or voltage is required to maintain memory. Nondestructive readout is achieved in an FEFET device since information is stored as a polarization direction rather than charge such as on a capacitor in an FERAM device. Operation speed (access and writing) of FEFET memory is $\leq 100$ ns and determined by the polarization switching time of a ferroelectric film.

Conventional MFS FET structures have a few problems, such as diffusion of Pb, Ti and other components of the ferroelectric material into the adjacent Si or $SiO_2$ layer. As a result of the diffusion, the trap density at the ferroelectric-Si interface dramatically increases to $\approx 10^{16}$, a level high enough to interfere with device switching. To solve this problem, a metal-ferroelectric-insulator structure in which a layer of $CaF_2$ or $MgAl_2O_3$ overlies the silicon layer and acts as a buffer layer between the ferroelectric film and the silicon layer, has been proposed. Another option is to grow an epitaxial ferroelectric $BaMnF_4$ film on the silicon layer; this can be done as part of the manufacture of the gate structure of the FET. However, fabrication of either of these alternative structures is relatively difficult and involves expensive molecular beam epitaxy processing.

A PZT ferroelectric can be disadvantageous in certain memory applications because of its tendency to act as a source of metals, e.g., Pb, Ti and Zr, as ionic contaminants. PZT ferroelectric materials are also undesirable for MFMIS structure-based NVM because of their high dielectric constants($\epsilon_f=1000$). Application of 2 V switching voltage requires 25 V to be applied to the 10 nm $SiO_2$ film ($E_{ox}=V_{ox}/t_{ox}=25$ Mv/cm), a very severe condition for a $SiO_2$ film. Scott, et al., Science, Vol. 246, pages 1400–1405 (December 1989) also discuss several problems related to fatigue in PZT films.

$SrBi_2Ta_2O_9$ has been used in FERAM elements with destructive readout as a polar material that is easy to switch at low voltages, but has not been used in MFMIS FET devices to date.

Therefore, a ferroelectric material having low dielectric constant and coercive field is needed for high speed, long-lasting MFMIS FET memory devices with nondestructive readout capability.

SUMMARY OF THE INVENTION

In order to solve these and other problems, a new ferroelectric memory element is proposed. Memory elements according to the present invention can be manufactured using conventional CMOS transistor technology and generally include a $SiN_xO_y$ layer or a bilayer structure of $SiO_2$ and $Si_3N_4$ metallic electrodes, and a $SrBi_2Ta_2O_9$ ferroelectric thin-film.

MFMIS (metal-ferroelectric-metal-insulator-semiconductor) FET structures according to the present invention have several advantages. First, conventional CMOS transistor processing can be used since additional layers are added above conventional FET structures. Second, platinum and/or a metal oxide serving as a bottom electrode can provide a lattice matching material for the overlying ferroelectric layer. Third, fatigue-free $SrBi_2Ta_2O_9$ can be used as the ferroelectric since it has a relatively low dielectric constant ($\epsilon=100$). The fatigue-free state enables high endurance for write operations ($>10^{12}$ cycles) at high speed (<100 ns) and standard supply voltages (3–5 V) without the use of charge pumps as needed for conventional floating-gate EEPROM devices. Fourth, formation of $SrBi_2Ta_2O_9$ or other ferroelectric members of the layered perovskite family is easy to integrate into conventional CMOS transistor processing. Fifth, a metallic electrode and silicon oxynitride or a $SiO_2$—$Si_3N_4$ bilayer underlying the ferroelectric layer desirably enhance resistance to diffusion into the silicon or oxide layer. (For this purpose, silicon nitride ($Si_3N_4$) may be used in combination with silicon oxide.)

A structure for the new memory element according to the present invention may include a CMOS FET with a thin (~100–200 Å) thermal oxynitride film overlying the silicon layer. A $SiN_xO_y$ or $SiO_2$—$Si_3N_4$ film is more preferred than $SiO_2$ to improve device hot carrier resistance, increase dielectric breakdown voltage, decrease radiation-induced trap buildup, decrease diffusion and reduce plasma damage to gate oxide. Metallic electrodes serve as a floating gate and bottom electrode. Suitable electrodes of platinum or a metallic oxide (e.g., $RuO_2$, $IrO_2$, $La_xSr_{1-x}CoO_3$) may be formed by RF sputtering.

An exemplary method for forming MFMIS FET structures according to the present invention follows. For example, the ferroelectric film is formed on the bottom electrode overlying a CMOS transistor structure. The ferroelectric layer may be formed by spin-coating a metal organic solution on a silicon layer followed by oxidation. (Additional details of this well-known procedure are set forth in Paz de Araujo, et al., PCT application No. WO 93\12542 (Jun. 24, 1993), and in Jones, Jr., et al., "Ferroelectric Nonvolatile Memories for Low-voltage, Low Power Applications," Thin Solid Films, 1995, Vol. 270, 584. The top electrode is deposited on the ferroelectric thin-film. structure according to the present invention has excellent parameters for the NVM application: low saturation voltage in the 2–4 V range and a coercive field of ~25 KV/cm. Also, this ferroelectric material has practically no polarization fatigue up to $10^{12}$ switching cycles, long retention and minimal tendency to imprint.

BRIEF DESCRIPTION OF THE DRAWINGS

The invention will be better understood by reference to the Figures, in which like reference numerals refer to the same element.

DESCRIPTION OF THE PREFERRED EMBODIMENTS

Figure 1:
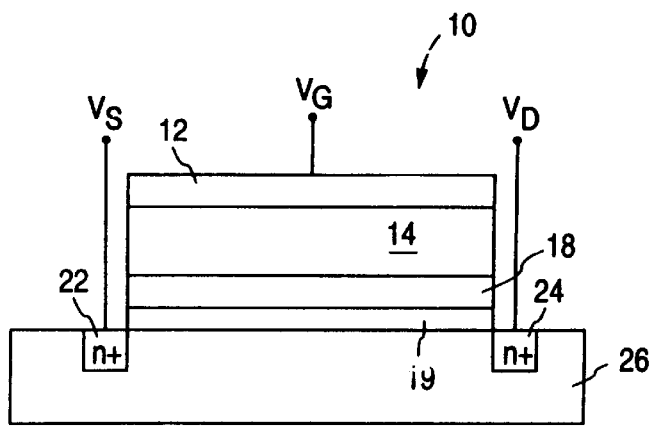
FIG. 1 is a sketch of a MFMIS FET structure according to the present invention.

As exemplified in FIG. 1, a MFMIS FET device 10 according to the present invention generally includes upper and lower electrodes 12 and 18, respectively, ferroelectric layer 14 and diffusion barrier layer 19 between the ferroelectric layer 14 and silicon substrate 26.

Suitable metallic electrodes are composed of platinum, a platinum upper electrode 12 is desirably about 500 Å thick while a platinum bottom electrode is about 1000 Å. The thickness of the ferroelectric layer 14 depends on its dielectric constant and coercive field; for $SrBi_2Ta_2O_9$, a suitable thickness is between about 3000 Å–4000 Å when using a 5 V switching voltage. For 3 V switching voltages, a thickness of about 2000 Å–2500 Å is suitable. Layered perovskites are preferred ferroelectric materials, of which $SrBi_2Ta_2O_9$ is especially preferred. Silicon oxynitride 100–200 Å thick may serve as the diffusion barrier 19. The diffusion barrier 19 may also be two layers, one of $Si_3N_4$ adjacent to one of $SiO_2$, as long as the layers provide an adequate dielectric constant overall.

Figure 2:
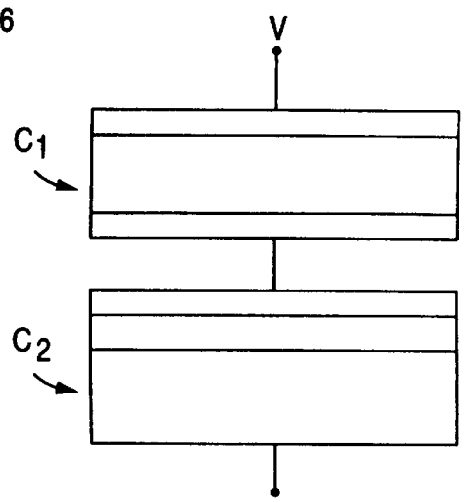
FIG. 2 is a sketch of an electrical analog of MFMIS FET structure according to the present invention showing two capacitors (C1, the capacitor of ferroelectric layer and C2, the capacitor of oxynitride layer) in series.

As shown in FIG. 2, MFMIS FET structures are electrically analogous to two capacitors (C1, the capacitor of ferroelectric layer and C2, the capacitor of oxynitride) in series (ignoring the capacitor of depletion layer of Si for simplicity). Information is stored as charge in the capacitors. A bias voltage V is applied between the two capacitors, becoming $V_F$ (voltage across the ferroelectric layer) and $V_{ox}$ (voltage across the oxynitride). The relationship between $V_F$ and $V_{ox}$ can be expressed $$\epsilon_F V_F t_{ox} = \epsilon_{ox} V_{ox} t_F, \text{ where } V = V_F + V_{ox},$$

where $\epsilon_F$ and $\epsilon_{ox}$ are the dielectric constants of the ferroelectric and $SiN_xO_y$ films and $t_F$ and $t_{ox}$ are the thicknesses of each film, respectively. If $t_F$=200 nm, $t_{ox}$=10 nm ($\epsilon_{ox}$=$^{-4}$), then the relationship between $V_F$ and $V_{ox}$ is $$V_F/V_{ox} = 20/\frac{\epsilon_{ox}}{\epsilon_F} = 80/\epsilon_F$$

To apply 2 V (100 KV/cm) to ferroelectrics to achieve switching requires 2.5 MV/cm electric field on $SiN_xO_y$ ($\epsilon_F$=100 for $SrBi_2Ta_2O_9$). High quality $SiN_xO_y$ or a $SiO_2$—$Si_3N_4$ bilayer structure are used to prevent interdiffusion and to increase dielectric constant of the gate insulator.

The operation principle of a n-MFMIS FET device 10, is described with reference to FIGS. 3a and 3b. Generally, operation of devices according to the present invention can be likened to CMOS flash NVM, except that the present invention has substantially higher speed for read/write operations and much higher cycling capabilities.

Figure 3A:
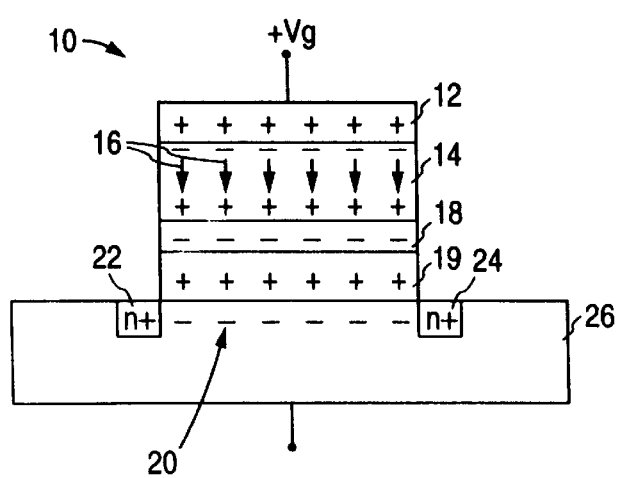
FIGS. 3a and 3b are sketches of the "ON" and "OFF" states, respectively, in the MFMIS FET structures according to the present invention.
Figure 3B:
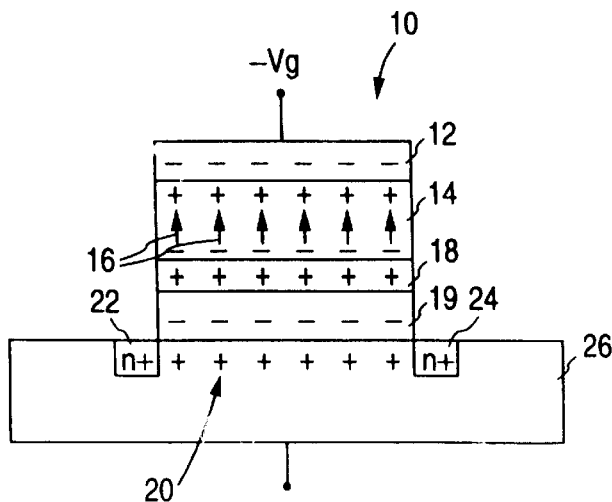

When a sufficiently large positive bias $V_g$ is applied to the upper electrode ("control gate") 12, polarization of ferroelectric layer 14 is in the direction of the downward arrows 16 shown in FIG. 3a, inducing corresponding charge distributions in bottom electrode ("floating gate") 18 and diffusion barrier layer 19.

A surface inversion layer (or "channel") 20 forms between source region 22 and drain region 24 in silicon layer 26 due to the charge distributions in bottom electrode/ floating gate 18 and in diffusion barrier layer 19. As a result, the source region 22 and drain region 24, e.g., two $n^+$ regions, are connected by channel 20, whereby the MFMIS FET device 10 is in an "ON" state. Even upon removal of the gate bias $V_g$, MFMIS FET 10 remains in the "ON" state because of remanent polarization of ferroelectric layer 14.

With a negative gate bias $V_g$, the direction of ferroelectric polarization reverses (as indicated by upward arrows 16 in ferroelectric layer 14) and numerous carriers (holes) accumulate at the interface of diffusion barrier 19 and silicon layer 26 (FIG. 3b) In this case, MFMIS FET 10 is in the "OFF" state, since the source-to-drain electrodes can be considered as two p-n junctions connected back to back. The MFMIS FET remains in the "OFF" state, when the bias voltage increases to 0 V, due to the switched remanent polarization of ferroelectric layer 14.

Unlike CMOS flash memory, MFMIS FET devices according to the present invention do not need a hot electron pump, therefore low-voltage, nondestructive and fast (~100 ns) read/write can be realized with ~$10^{12}$ cycle endurance. In this way, the nonvolatile memory device according to the present invention stores information as a polarization direction (channel conductivity) rather than as charge on a capacitor. Readout may therefore be accomplished nondestructively because information is stored as a polarization direction rather than charge. Readout is achieved simply by sensing whether the MFMIS FET is on or off as described above.

While the present invention is disclosed by reference to the preferred embodiments and examples detailed above, it is to be understood that these examples are intended in an illustrative rather than limiting sense, as it is contemplated that many modifications within the scope and spirit of the invention will readily occur to those skilled in the art and the appended claims are intended to cover such variations.

I claim:

1. A ferroelectric nonvolatile memory device with nondestructive readout, comprising:

a silicon substrate having source and drain regions;

a ferroelectric capacitor containing a ferroelectric layer between an upper electrode and a lower electrode, wherein said lower electrode is a floating gate of a transistor and said ferroelectric layer includes a ferroelectric material having a layered perovskite structure; and a gate dielectric layer overlying said silicon substrate and underlying said lower electrode, said gate dielectric layer isolating said substrate from species diffusing from said ferroelectric layer and having a sufficient dielectric constant to distribute voltage applied to said device such that there is a greater voltage drop across said ferroelectric layer compared to that across said gate dielectric.

2. A ferroelectric nonvolatile memory device according to claim 1, wherein said ferroelectric layer is $SrBi_2Ta_2O_9$ between about 2000 Å and 4000 Å thick and the device switching voltage is between about 3 volts and 5 volts.

3. A ferroelectric nonvolatile memory device according to claim 1, wherein said diffusion barrier layer comprises a layer of $SiN_xO_y$.

4. A ferroelectric nonvolatile memory device according to claim 1, wherein said diffusion barrier layer comprises a layer of $Si_3N_4$ adjacent to a layer of $SiO_2$, where the $SiO_2$ is adjacent to the silicon substrate.

* * * * *